United States Patent
Yu et al.

(10) Patent No.: US 9,613,926 B2
(45) Date of Patent: Apr. 4, 2017

(54) WAFER TO WAFER BONDING PROCESS AND STRUCTURES

(71) Applicant: Taiwan Semiconductor Manufacturing Company, Ltd., Hsin-Chu (TW)

(72) Inventors: Chen-Hua Yu, Hsin-Chu (TW); Ming-Fa Chen, Taichung (TW); Wen-Ching Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/712,729

(22) Filed: May 14, 2015

(65) Prior Publication Data

US 2016/0190089 A1 Jun. 30, 2016

Related U.S. Application Data

(60) Provisional application No. 62/096,972, filed on Dec. 26, 2014.

(51) Int. Cl.
 *H01L 23/00* (2006.01)
 *B81C 3/00* (2006.01)
 (Continued)

(52) U.S. Cl.
 CPC ............. *H01L 24/81* (2013.01); *B81C 3/001* (2013.01); *H01L 21/50* (2013.01); *H01L 23/10* (2013.01); *H01L 24/03* (2013.01); *H01L 24/05* (2013.01); *H01L 24/11* (2013.01); *H01L 24/13* (2013.01); *H01L 24/16* (2013.01); *H01L 24/27* (2013.01); *H01L 24/29* (2013.01); *H01L 24/32* (2013.01); *H01L 24/83* (2013.01); *H01L 24/92* (2013.01); *H01L 24/94* (2013.01); *H01L 24/06* (2013.01); *H01L 24/08* (2013.01); *H01L 24/73* (2013.01);
 (Continued)

(58) Field of Classification Search
 CPC ......... H01L 24/81; H01L 24/03; H01L 24/11; H01L 24/14; H01L 24/06; H01L 2224/0401; H01L 2224/0614; H01L 2224/1414
 USPC ........................................... 438/107
 See application file for complete search history.

(56) References Cited

U.S. PATENT DOCUMENTS 7,138,293 B2  11/2006 Ouellet et al.
2008/0188059 A1*  8/2008 Yazdi ............... B81C 1/00253
                                                    438/456

(Continued)

*Primary Examiner* — Caleen Sullivan
(74) *Attorney, Agent, or Firm* — Slater Matsil, LLP

(57) ABSTRACT

Bonded structures and method of forming the same are provided. A conductive layer is formed on a first surface of a bonded structure, the bonded structure including a first substrate bonded to a second substrate, the first surface of the bonded structure being an exposed surface of the first substrate. A patterned mask having first openings and second openings is formed on the conductive layer, the first openings and the second openings exposing portions of the conductive layer. First portions of first bonding connectors are formed in the first openings and first portions of second bonding connectors are formed in the second openings. The conductive layer is patterned to form second portions of the first bonding connectors and second portions of the second bonding connectors. The bonded structure is bonded to a third substrate using the first bonding connectors and the second bonding connectors.

20 Claims, 13 Drawing Sheets

(51) Int. Cl.
*H01L 23/10* (2006.01)
*H01L 21/50* (2006.01)

(52) U.S. Cl.
CPC ...... *H01L 24/80* (2013.01); *H01L 2224/0345* (2013.01); *H01L 2224/03452* (2013.01); *H01L 2224/03462* (2013.01); *H01L 2224/03464* (2013.01); *H01L 2224/03602* (2013.01); *H01L 2224/03614* (2013.01); *H01L 2224/03616* (2013.01); *H01L 2224/03912* (2013.01); *H01L 2224/0401* (2013.01); *H01L 2224/04026* (2013.01); *H01L 2224/056* (2013.01); *H01L 2224/05022* (2013.01); *H01L 2224/05073* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05149* (2013.01); *H01L 2224/05155* (2013.01); *H01L 2224/05166* (2013.01); *H01L 2224/05184* (2013.01); *H01L 2224/05548* (2013.01); *H01L 2224/05567* (2013.01); *H01L 2224/05569* (2013.01); *H01L 2224/05571* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05684* (2013.01); *H01L 2224/06051* (2013.01); *H01L 2224/08225* (2013.01); *H01L 2224/119* (2013.01); *H01L 2224/1145* (2013.01); *H01L 2224/1147* (2013.01); *H01L 2224/11452* (2013.01); *H01L 2224/11462* (2013.01); *H01L 2224/11464* (2013.01); *H01L 2224/11614* (2013.01); *H01L 2224/11912* (2013.01); *H01L 2224/131* (2013.01); *H01L 2224/13012* (2013.01); *H01L 2224/13013* (2013.01); *H01L 2224/13014* (2013.01); *H01L 2224/13082* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13164* (2013.01); *H01L 2224/13166* (2013.01); *H01L 2224/16014* (2013.01); *H01L 2224/16147* (2013.01); *H01L 2224/279* (2013.01); *H01L 2224/2745* (2013.01); *H01L 2224/2747* (2013.01); *H01L 2224/27452* (2013.01); *H01L 2224/27462* (2013.01); *H01L 2224/27464* (2013.01); *H01L 2224/27614* (2013.01); *H01L 2224/27912* (2013.01); *H01L 2224/291* (2013.01); *H01L 2224/29011* (2013.01); *H01L 2224/29013* (2013.01); *H01L 2224/29014* (2013.01); *H01L 2224/29082* (2013.01); *H01L 2224/29111* (2013.01); *H01L 2224/29124* (2013.01); *H01L 2224/29138* (2013.01); *H01L 2224/29139* (2013.01); *H01L 2224/29144* (2013.01); *H01L 2224/29147* (2013.01); *H01L 2224/29149* (2013.01); *H01L 2224/29155* (2013.01); *H01L 2224/29164* (2013.01); *H01L 2224/29166* (2013.01); *H01L 2224/32014* (2013.01); *H01L 2224/32147* (2013.01); *H01L 2224/32225* (2013.01); *H01L 2224/73103* (2013.01); *H01L 2224/80805* (2013.01); *H01L 2224/80893* (2013.01); *H01L 2224/80894* (2013.01); *H01L 2224/80895* (2013.01); *H01L 2224/80896* (2013.01); *H01L 2224/8183* (2013.01); *H01L 2224/81815* (2013.01); *H01L 2224/8383* (2013.01); *H01L 2224/83805* (2013.01); *H01L 2224/83815* (2013.01); *H01L 2224/92* (2013.01); *H01L 2224/9202* (2013.01); *H01L 2224/94* (2013.01); *H01L 2924/10158* (2013.01); *H01L 2924/1461* (2013.01); *H01L 2924/163* (2013.01)

(56) References Cited

U.S. PATENT DOCUMENTS

| | | |
|---|---|---|
| 2009/0140356 A1 | 6/2009 | Yazdi |
| 2009/0224371 A1* | 9/2009 | Yu ................... H01L 21/76898 257/621 |
| 2012/0248615 A1 | 10/2012 | Chien et al. |

* cited by examiner

WAFER TO WAFER BONDING PROCESS AND STRUCTURES

PRIORITY CLAIM AND CROSS-REFERENCE

This application claims the benefit of the following provisionally filed U.S. patent application: Application Ser. No. 62/096,972, filed Dec. 26, 2014, and entitled "Wafer to Wafer Bonding Process and Structures," which application is hereby incorporated herein by reference.

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers, and active circuits such as logic, memory, processor circuits and the like located on different semiconductor wafers. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
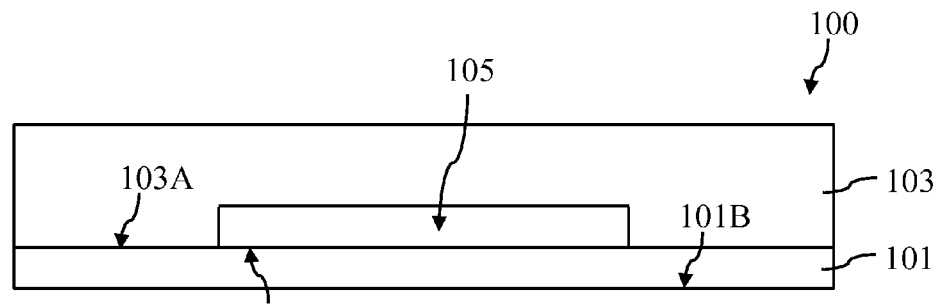
FIGS. 1A-1E, 2A-2C, 3A and 3B illustrate cross-sectional views of intermediate stages of manufacture of a bonded structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a bonded structure that is formed by bonding two or more wafers. In some embodiments, wafers may be microelectromechanical systems (MEMS) wafers, complementary metal-oxide-semiconductor (CMOS) wafers, and/or the like.

Figure 1B:
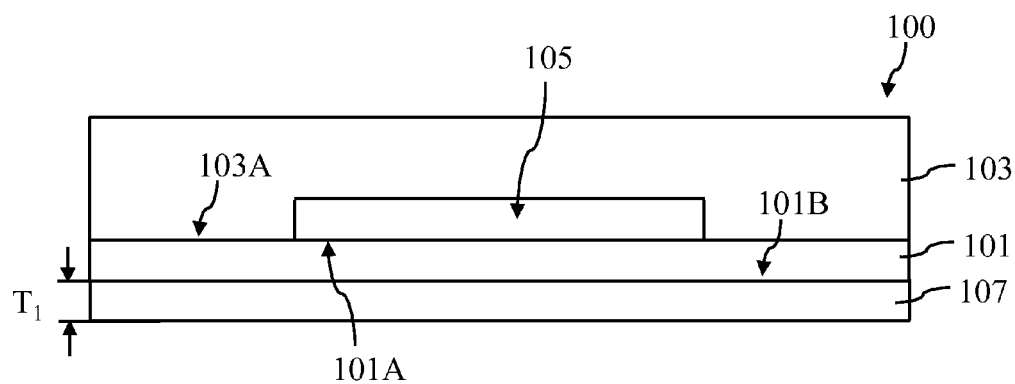
Figure 1C:
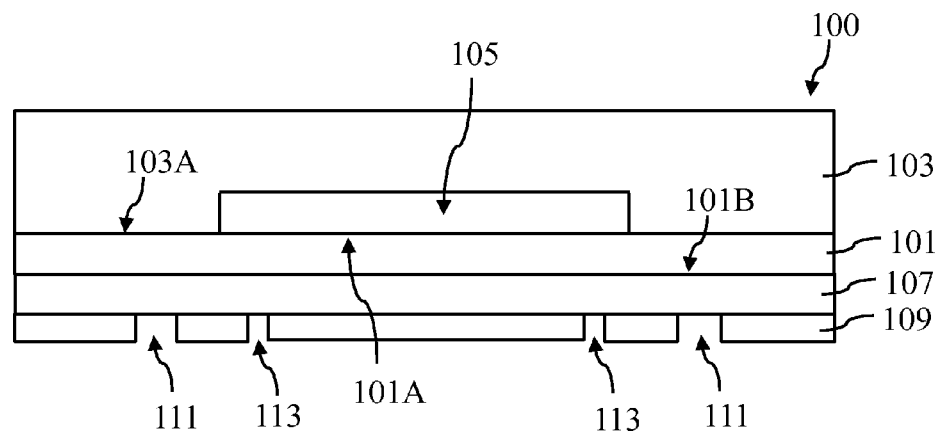
Figure 1D:
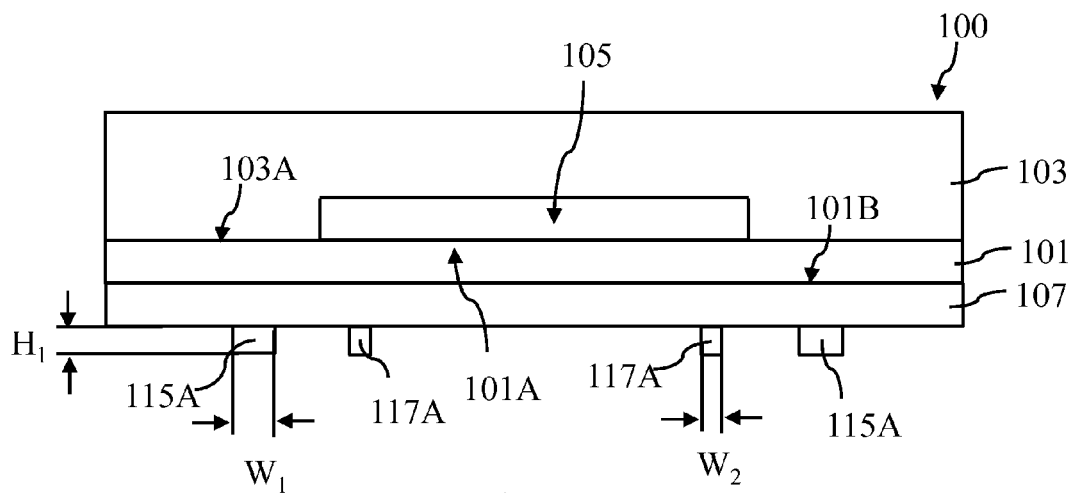
Figure 1E:
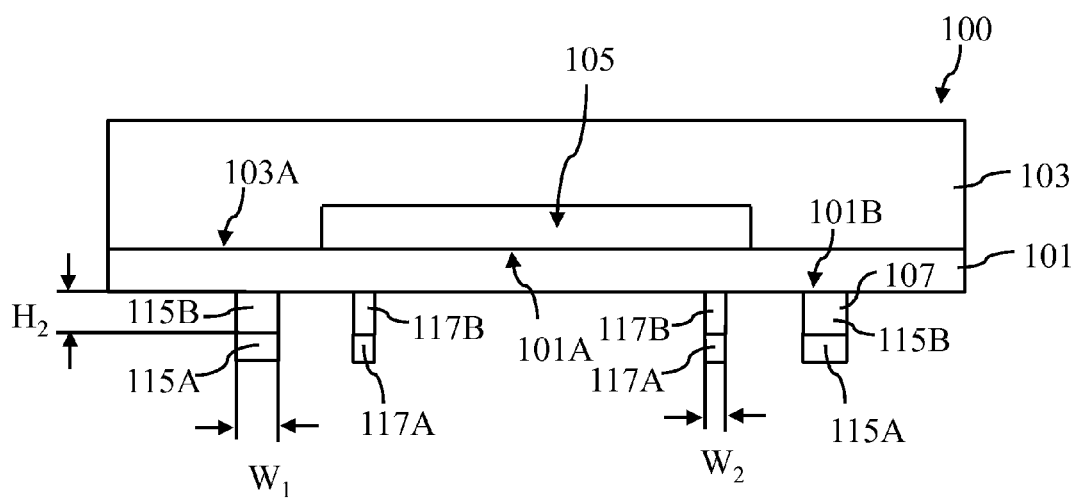
Figure 2A:
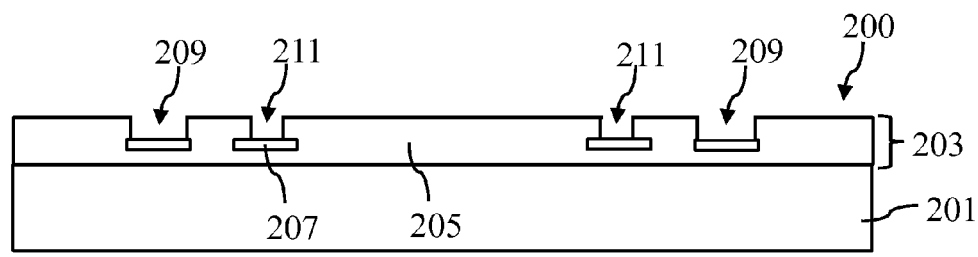
Figure 2B:
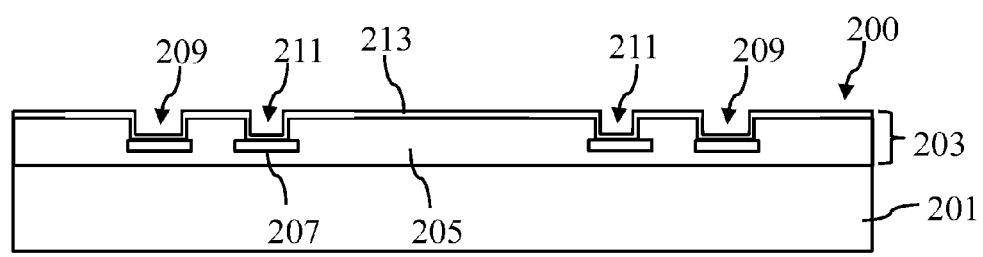
Figure 2C:
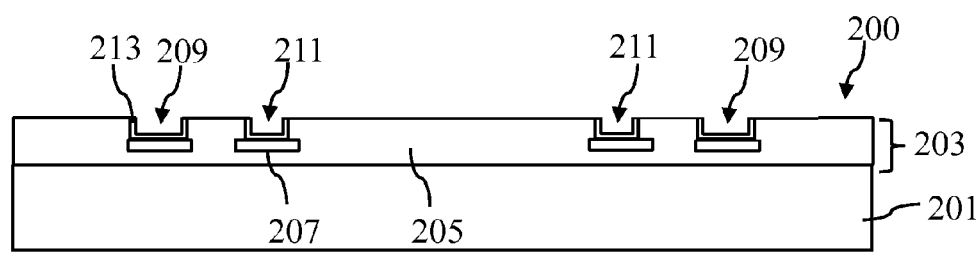
Figure 3A:
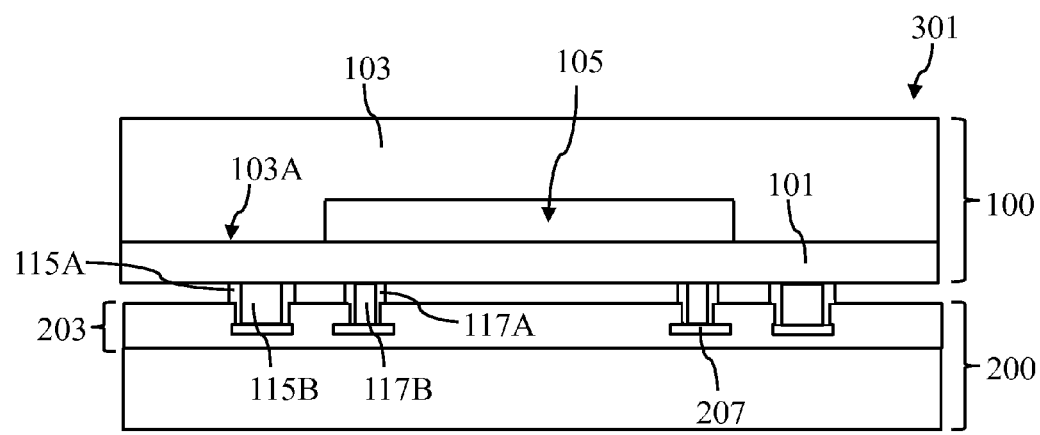
Figure 3B:
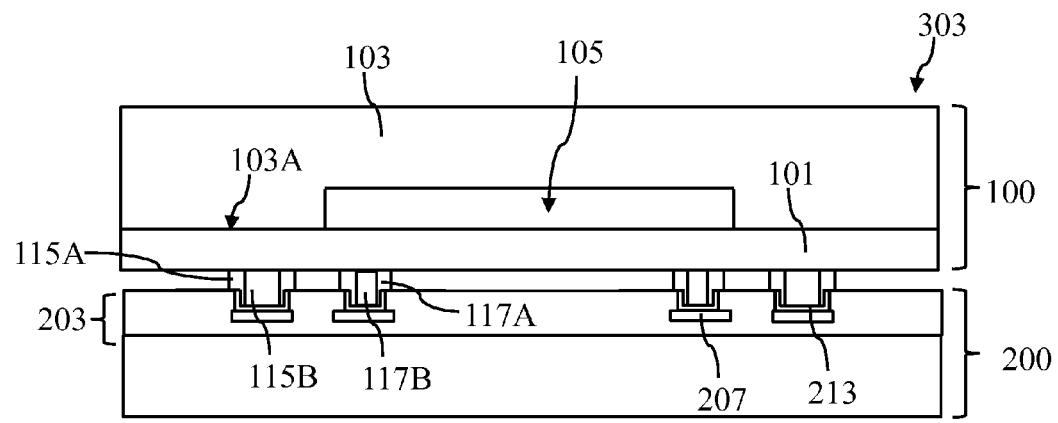

FIGS. 1A-1E, 2A-2C, 3A and 3B illustrate cross-sectional views of intermediate stages of manufacture of a bonded structure in accordance with some embodiments. In particular, FIGS. 1A-1E illustrate cross-sectional views of intermediate stages of preparing a first bonded structure 100 comprising a first wafer 101 bonded to a second wafer 103 for a subsequent bonding process. FIGS. 2A-2C illustrate cross-sectional views of intermediate stages of preparing a third wafer 200 for a subsequent bonding process. FIGS. 3A and 3B illustrate cross-sectional views of second bonded structures 301 and 303, respectively, comprising the first bonded structure 100 bonded to the third wafer 200 in accordance with some embodiments.

Referring first to FIG. 1A, the first bonded structure 100 comprising the first wafer 101 bonded to the second wafer 103 is illustrated in accordance with some embodiments. In the illustrated embodiments, the first wafer 101 may be formed using MEMS processes and may also be referred to as a MEMS wafer 101. The second wafer 103 may act as a cap for the MEMS wafer 101 and may also be referred to as a cap wafer 103.

In some embodiments, the MEMS wafer 101 may comprise a substrate and various devices on the substrate, which are not explicitly illustrated in FIG. 1A as their inclusion is not necessary for understanding various embodiments described below. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

The various devices may comprise MEMS devices including cavities, membranes, resonators, cantilevered elements, pressure sensors, accelerometers, motion sensors, gyroscopes, and/or the like and may be formed using conventional MEMS techniques. The various devices may further comprise various active and passive CMOS devices including transistors, capacitors, resistors, diodes, photo-diodes, fuses and/or the like.

In some embodiments, the cap wafer 103 may or may not be a CMOS wafer, which may or may not have electrical circuits (not shown). In particular, the cap wafer 103 may comprise a substrate and various active and passive CMOS devices including transistors, capacitors, resistors, diodes, photo-diodes, fuses and/or the like. In some embodiments, the cap wafer 103 may also include dielectric layers, conductive lines and vias for electrical routing. The substrate of the cap wafer 103 may be similar to the substrate of the MEMS wafer 101 and the description is not repeated herein. Alternatively, the cap wafer 103 may be formed of other suitable materials including a ceramic material, quartz, or the like.

In some embodiments, cavities such as a cavity 105 are formed in the cap wafer 103. The cavity 105 may function as a sealed cavity for various MEMS devices after the cap wafer 103 is bonded to the MEMS wafer 101. In some embodiments, the cavity 105 may be formed using suitable lithography and etching methods. In FIG. 1A, a single cavity 105 is shown for illustrative purpose only. The number of cavities may vary depending on design requirements of the MEMS wafer 101.

Referring further to FIG. 1A, in some embodiments, a first surface 103A of the cap wafer 103 is bonded to a first surface 101A of the MEMS wafer 101 to form the first bonded structure 100. The cavity 105 of the cap wafer 103 may be aligned with MEMS devices of the MEMS wafer 101. The MEMS wafer 101 may be bonded to the cap wafer 103 using any suitable technique such as fusion bonding (e.g., oxide-to-oxide bonding, metal-to-metal bonding, hybrid bonding, etc.), anodic bonding, eutectic bonding, the like, or a combination thereof. In some embodiments, the MEMS wafer 101 may be fusion bonded to the cap wafer 103 using a thin layer formed of polysilicon or other suitable materials (not shown) as a bonding interface. In some embodiments, after the first bonded structure 100 is formed, the sealed cavity 105 may have a low pressure (high vacuum) as the bonding process may be performed in a low-pressure environment. In other embodiments, the sealed cavity 105 may have any suitable pressure depending on design requirements of the MEMS wafer 101.

In some embodiments, the MEMS wafer 101 may be thinned before or after forming the first bonded structure 100 such that one or more conductive features (not shown) may be exposed on a second surface 101B of the MEMS wafer 101. In some embodiments, the thinning process may include a grinding process, a chemical mechanical polishing (CMP) process, or the like. As described below in greater detail, bonding connectors will be formed on the second surface 101B of the MEMS wafer 101. In some embodiments, the bonding connectors may not be coupled to the one or more conductive features on the second surface 101B of the MEMS wafer 101 and may be used to mechanically bond the bonded structure 100 to another wafer. In other embodiments, the bonding connectors may be coupled to the one or more conductive features on the second surface 101B of the MEMS wafer 101 and may be used to mechanically bond and electrically couple the bonded structure 100 to another wafer.

Referring to FIG. 1B, a conductive layer 107 is formed on the second surface 101B of the MEMS wafer 101. As described below in greater detail, the conductive layer 107 is subsequently patterned to form bonding connectors (such as first bonding connectors 115A/115B and second bonding connectors 117A/117B illustrated, for example, in FIG. 1E) on a second surface 101B (opposite of the first surface 101A) of the MEMS wafer 101 to prepare the MEMS wafer 101 for a subsequent bonding process. In some embodiments, the bonding connectors will be used to bond the MEMS wafer 101 to the third wafer 200 (see, for example, FIGS. 3A and 3B). The conductive layer 107 may comprise one or more layers of copper, titanium, nickel, gold, manganese, the like, or a combination thereof, and may be formed by ALD, PVD, evaporation, sputtering, the like, or a combination thereof. In some embodiments, the conductive layer 107 may have a thickness $T_1$ between about 2 µm and about 4 µm. In some embodiments, the conductive layer 107 comprises a layer of copper having a thickness between about 1.95 µm and about 3.9 µm formed over a layer of titanium having a thickness between about 500 Å and about 1000 Å.

Referring to FIG. 1C, a patterned mask 109 is formed on an exposed surface of the conductive layer 107. In some embodiments, the patterned mask 109 comprises a photoresist material, or any photo-patternable material. In some embodiments, a material of the patterned mask 109 is deposited, irradiated (exposed) and developed to remove portions of the material and form first openings 111 and second openings 113, thereby forming the patterned mask 109. In the illustrated embodiment, the first openings 111 and the second openings 113 expose portions of the conductive layer 107 and define a pattern for subsequently formed bonding connectors (such as the first bonding connectors 115A/115B and the second bonding connectors 117A/117B illustrated in FIG. 1E). As described below in greater detail, a first portion of a bond ring will be formed in the first openings 111 and first portions of bond pads will be formed in the second openings 113. In the illustrated embodiment, two first openings 111 are illustrated. However, in some embodiments, the two first openings 111 may be a part of a single continuous opening as viewed from the top, and may have an annular circular shape, an annular rectangular shape, or the like. In some embodiments, top-view shapes of the second openings 113 may be circles, ovals, polygons such as triangles, rectangles, hexagons, or the like. In the illustrated embodiment, the number of the first openings 111 and the second openings 113 is provided for illustrative purpose only. In other embodiments, the number of the first openings 111 and the second openings 113 may vary according to design requirements of the MEMS wafer 101 and the third wafer 200.

Referring to FIG. 1D, in some embodiments, first portions 115A of the first bonding connectors 115A/115B and first portions 117A of the second bonding connectors 117A/117B are formed in the first openings 111 and the second openings 113, respectively. In some embodiments, the first portions 115A of the first bonding connectors 115A/115B and the first portions 117A of the second bonding connectors 117A/117B comprise a suitable conductive material such as solder, copper, aluminum, gold, nickel, silver, palladium, tin, the like, or a combination thereof and may be formed using, an electro-chemical plating process, an electroless plating process, or the like. In some embodiments, the first portions 115A of the first bonding connectors 115A/115B and the first portions 117A of the second bonding connectors 117A/117B may have a height $H_1$ between about 0.5 µm and about 1 µm. In some embodiments, the first portions 115A of the first bonding connectors 115A/115B may have a width $W_1$ between about 30 µm and about 70 µm, and the first portions 117A of the second bonding connectors 117A/117B may have a width $W_2$ between about 10 µm and about 50 µm. Subsequently, the patterned mask 109 is removed to expose sidewalls of the first portions 115A of the first bonding connectors 115A/115B and the first portions 117A of the second bonding connectors 117A/117B. In some embodiments wherein the patterned mask 109 is formed of a photoresist material, the patterned mask 109 may be removed using, for example, an ashing process followed by a wet clean process.

Referring to FIG. 1E, the conductive layer 107 is patterned to form second portions 115B of the first bonding connectors 115A/115B and second portions 117B of the second bonding connectors 117A/117B. In some embodiments, the conductive layer 107 may be patterned using one or more etching processes while using the first portions 115A of the first bonding connectors 115A/115B and the first portions 117A of the second bonding connectors 117A/117B as an etch mask. Accordingly, in the illustrated embodiment, the second portions 115B of the first bonding connectors 115A/115B have the width $W_1$ and the second portions 117B of the second bonding connectors 117A/117B have the width $W_2$. Furthermore, the second portions 115B of the first bonding connectors 115A/115B and the second portions 117B of the second bonding connectors 117A/117B have a height $H_2$, which is equal to the thickness $T_1$ of the conductive layer 107. In some embodiment wherein the conductive layer 107 comprises a copper layer formed over a titanium layer, the conductive layer 107 may be etched using, for example, a mixture of $FeCl_3$, HCl, and $H_2O$ (for etching copper) and a mixture of $H_2O_2$, HF, and $H_2O$ (for etching titanium).

Referring further to FIG. 1E, top-view shapes of the first bonding connectors 115A/115B and the second bonding connectors 117A/117B are similar to the top-view shapes of the first openings 111 and the second openings 113, respectively, and the description is not repeated herein. In what follows, the first bonding connectors 115A/115B may be also referred to as a bond ring 115A/115B and the second bonding connectors 117A/117B may be also referred to as bond pads 117A/117B. As described below in greater detail, the first bonding connectors 115A/115B and the second bonding connectors 117A/117B will be used to bond and electrically couple the first bonded structure 100 to the third wafer 200 (see, for example, FIGS. 3A and 3B). As described above with reference to FIG. 1A-1E, the first bonding connectors 115A/115B and the second bonding connectors 117A/117B are formed without patterning the second surface 101B of the MEMS wafer 101, which advantageously allows for forming bonding connectors having high thickness uniformity with reduced cost.

FIGS. 2A-2C illustrate cross-sectional views of intermediate stages of preparing the third wafer 200 for a subsequent bonding process. Referring first to FIG. 2A, a portion of the third wafer 200 is illustrated. In some embodiments, the third wafer 200 may be formed using CMOS processes and may be also referred to as a CMOS wafer 200. In some embodiments, the CMOS wafer 200 comprises a substrate, various active and passive devices on the substrate, and various metallization layers over the substrate, which are collectively illustrated in FIG. 2A by a layer 201. In some embodiments, the substrate of the CMOS wafer 200 may be similar to the substrate of the MEMS wafer 101 and the description is not repeated herein.

In some embodiments, the various active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spin-on coating, chemical vapor deposition (CVD), plasma enhanced CVD (PECVD), or the like.

In some embodiments, interconnect structures may be formed in the ILD/IMDs using, for example, a damascene process, a dual damascene process, or the like. The ILD/IMDs may be patterned using photolithography techniques to form trenches and vias. The interconnect structures may be formed by depositing a suitable conductive material in the trenches and the vias of the ILD/IMDs using various deposition and plating methods, or the like. In addition, the interconnect structures may include one or more barrier/adhesion layers to protect the ILD/IMDs from diffusion and metallic poisoning. The one or more barrier/adhesion layers may comprise titanium, titanium nitride, tantalum, tantalum nitride, or other alternatives. The barrier layer may be formed using physical vapor deposition (PVD), ALD, sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A chemical-mechanical polishing (CMP) is then performed to remove excess portions of the interconnect structures. In some embodiments, the interconnect structures may provide electrical connections between the various passive and active devices formed on the substrate.

In some embodiments, contact pads (not shown) may be formed over the metallization layer. The formation of the contact pads may include blanket depositing a conductive layer and patterning the conductive layer to form the contact pads. The contact pads may comprise a conductive material such as copper, tungsten, aluminum, silver, gold, the like, an alloy thereof, or a combination thereof. A passivation layer (not shown) may be formed over the contact pads and patterned to expose portions of the contact pads. In some embodiments, the passivation layer may comprise dielectric materials such as silicon nitride, silicon carbide, silicon oxide, silicon oxynitride, the like, or a combination thereof, and may be formed using CVD, PVD, ALD, the like, or a combination thereof. In other embodiments, the passivation layer may comprise polymers including, but not limited to, polyimide (PI), benzocyclobutene (BCB), polybenzoxazole (PBO), the like, or a combination thereof, and may be formed using, for example, a spin-on coating method, or the like. The passivation layer may be patterned using suitable lithography and etching methods.

Referring further to FIG. 2A, one or more redistribution layers (RDLs) 203 are formed over the contact pads. In some embodiments, the RDLs 203 may comprise one or more dielectric layers 205 and one or more conductive features 207 (such as for example, conductive lines and vias) formed within the one or more dielectric layers 205. In some embodiments, the one or more dielectric layers 205 may comprise polymers including, but not limited to, polyimide (PI), benzocyclobutene (BCB), polybenzoxazole (PBO), the like, or a combination thereof, and may be formed using, for example, a spin-on coating method, or the like. The one or more conductive features 207 may comprise a seed layer (not shown) and a conductive material formed over the seed layer. The seed layer may comprise copper, titanium, nickel, gold, manganese, the like, or a combination thereof, and may be formed by ALD, PVD, sputtering, the like, or a combination thereof. The conductive material including copper, tungsten, aluminum, silver, gold, the like, or a combination thereof, may be formed on the seed layer by an electro-chemical plating process, an electroless plating process, ALD, PVD, the like, or a combination thereof.

In some embodiments, a topmost dielectric layer (not individually shown) of the one or more dielectric layers 205 is patterned to form first openings 209 and second openings 211. In some embodiments, the topmost dielectric layer of the one or more dielectric layers 205 may be patterned using suitable photolithography methods. The first openings 209 and the second openings 211 expose portions of the one or more conductive feature 207. As described below in greater detail, the MEMS wafer 101 and the CMOS wafer 200 are bonded by inserting the first bonding connectors 115A/115B and the second bonding connectors 117A/117B into the first openings 209 and the second openings 211, respectively, and contacting the exposed portions of the one or more conductive features 207. Accordingly, dimensions and shapes of the first openings 209 and the second openings 211 are designed to accommodate the first bonding connectors 115A/115B and the second bonding connectors 117A/117B. In some embodiments, widths of the first openings 209 and the second openings 211 are greater than the width $W_1$ of the first bonding connectors 115A/115B and the width $W_2$ of the second bonding connectors 117A/117B, respectively. In some embodiments, heights of the first openings 209 and the second openings 211 are less than the height $H_1+H_2$ of the first bonding connectors 115A/115B and the second bonding connectors 117A/117B. In other embodiments, heights of the first openings 209 and the second openings 211 are less than the height $H_2$ of the second portions 115B of the first bonding connectors 115A/115B and the second portions 117B of the second bonding connectors 1117A/117B.

Referring to FIG. 2B, a seed layer 213 is blanket formed over the RDLs 203 and in the first openings 209 and the second openings 211. In some embodiments, the seed layer 213 may include similar materials and may be formed using similar methods as the conductive layer 107 described above with reference to FIG. 1B and the description is not repeated herein. In some embodiments, the seed layer 213 may comprise a layer of copper having a thickness between about 0.5 μm and about 2 μm formed over a layer of titanium having a thickness between about 200 Å and about 500 Å.

Referring to FIG. 2C, the portions of the seed layer 213 disposed on a topmost surface of the RDLs 203 is removed such that the seed layer 213 remains only in the first openings 209 and the second openings 211 and forms under-bump metallizations (UBMs) 213 for the first bonding connectors 115A/115B and the second bonding connectors 117A/117B. In some embodiments, the portions of the seed layer 213 disposed on the topmost surface of the RDLs 203 may be removed using, for example, grinding, a CMP process, or the like.

FIG. 3A illustrates a cross-sectional views of a second bonded structure 301 comprising the first bonded structure 100 bonded to the CMOS wafer 200 shown in FIG. 2A in accordance with some embodiments. In the illustrated embodiment, the CMOS wafer 200 is bonded to the first bonded structure 100 without forming the UBMs 213 in the first openings 209 and the second openings 211. In some embodiments, the first bonding connectors 115A/115B and the second bonding connectors 117A/117B of the first bonded structure 100 are aligned opposite to the first openings 209 and the second openings 211, respectively, of the CMOS wafer 200. Subsequently, the first bonded structure 100 and the CMOS wafer 200 are brought into contact such that the first bonding connectors 115A/115B and the second bonding connectors 117B/117B extend into the first openings 209 and the second openings 211, respectively, and contact respective exposed conducive features 207 of the RDLs 203.

In some embodiments wherein the first portions 115A of the first bonding connectors 115A/115B and the first portions 117A of the second bonding connectors 117A/117B are formed of a solder such as, for example, tin (Sn), a reflow process may be performed in order to shape the solder into the desired connector shapes. In the illustrated embodiment, after the reflow process, the first portions 115A of the first bonding connectors 115A/115B fill the first openings 209 and extend along sidewalls of the respective second portions 115B of the first bonding connectors 115A/115B. Similarly, the first portions 117A of the second bonding connectors 117A/117B fill the second openings 211 and extend along sidewalls of the respective second portions 117B of the second bonding connectors 117A/117B. In the illustrated embodiment, the second portions 115B of the first bonding connectors 115A/115B and the second portions 117B of the second bonding connectors 117A/117B directly contact the corresponding conductive features 207 of the RDLs 203. In other embodiments, a material of the first portions 115A of the first bonding connectors 115A/115B may be interposed between the respective second portions 115B the first bonding connectors 115A/115B and the respective conductive features 207 of the RDLs 203. Similarly, a material of the first portions 117A of the second bonding connectors 117A/117B may be interposed between the respective second portions 117B of the second bonding connectors 117A/117B and the respective conductive features 207 of the RDLs 203.

Referring further to FIG. 3A, in some embodiments, the first bonding connectors 115A/115B and the second bonding connectors 117A/117B mechanically and electrically couple the first bonded structure 100 to the CMOS wafer 200. In some embodiments wherein the first bonding connectors 115A/115B form a bond ring, the first bonding connectors 115A/115B may provide only mechanical bonds and may be electrically inert. In such embodiments, the bond ring 115A/115B may hermetically seal the MEMS devices of the MEMS wafer 101 from external environment. In other embodiments, the bond ring 115A/115B may be electrically coupled to the ground. In yet other embodiments, the bond ring 115A/115B may be electrically coupled to the MEMS devices of the MEMS wafer 101 and to the various active and passive devices of the CMOS wafer 200.

FIG. 3B illustrates a cross-sectional views of a second bonded structure 303 comprising the first bonded structure 100 bonded to the CMOS wafer 200 shown in FIG. 2C in accordance with some embodiments. In the illustrated embodiment, the CMOS wafer 200 is bonded to the first bonded structure 100 after forming the UBMs 213 in the first openings 209 and the second openings 211 (see, for example, FIGS. 2B and 2C). In some embodiments, the second bonded structure 303 may be formed using similar methods as the second bonded structure 301 and the description is not repeated herein. In the illustrated embodiments, the UBMs 213 are interposed between the first bonding connectors 115A/115B and the respective conductive features 207 of the RDLs 203, and between the second bonding connectors 117A/117B and the respective conductive features 207 of the RDLs 203.

Figure 4:
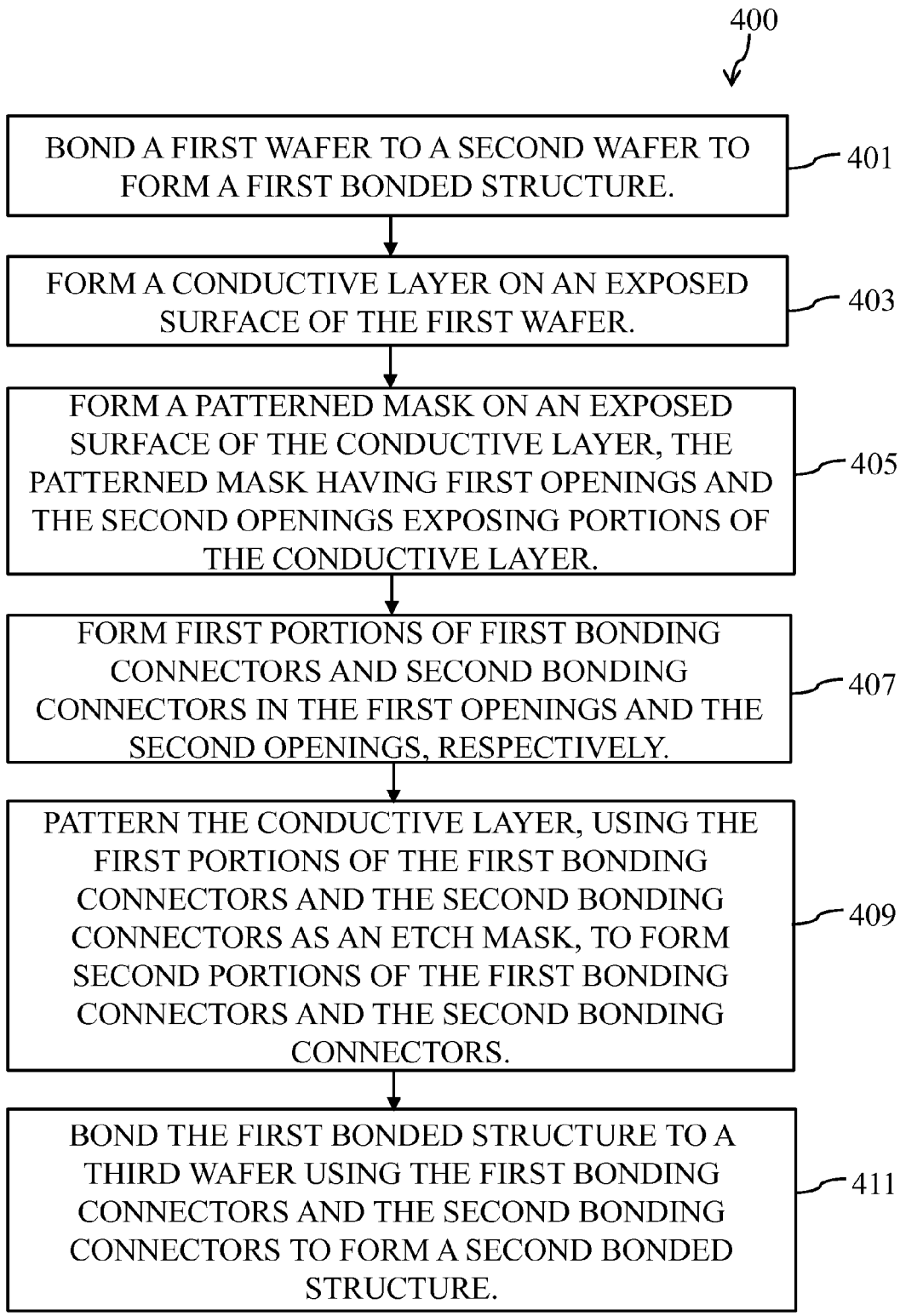
FIG. 4 is a flow diagram illustrating a method of forming a bonded structure in accordance with some embodiments.

FIG. 4 is a flow diagram illustrating a method 400 of forming a bonded structure (such as the second bonded structures 301 or 303) in accordance with some embodiments. The method 400 starts with step 401, wherein a first wafer (such as the MEMS wafer 101) is bonded to a second wafer (such as the cap wafer 103) to form a first bonded structure (such as the first bonded structure 100) as described above with reference to FIG. 1A. In step 403, a conductive layer (such as the conductive layer 107) is formed on an exposed surface of the first wafer as described above with reference to FIG. 1B. In step 405, a patterned mask (such as the patterned mask 109) having first openings (such as the first openings 111) and second openings (such as the second openings 113) is formed on an exposed surface of the conductive layer as described above with reference to FIG. 1C. In step 407, first portions of first bonding connectors and second bonding connectors (such as the first portions 115A of the first bonding connectors 115A/115B and the first portions 117A of the second bonding connectors 117A/117B) are formed in the first openings and the second openings, respectively, as described above with reference to FIG. 1D. In step 409, the conductive layer is patterned to form second portions of the first bonding connectors and the second bonding connectors (such as the second portions 115B of the first bonding connectors 115A/115B and the second portions 117B of the second bonding connectors 117A/117B) as described above with reference to FIG. 1E. In some embodiments, the first portions of the first bonding connectors and the second bonding connectors may be used as an etch mask for the conductive layer. In step 411, the first bonded structure is bonded to a third wafer (such as the CMOS wafer 200) using the first bonding connectors and the second bonding connectors to form a second bonded structure (such as, for example, the second bonded structures 301 or 303) as described above with reference to FIGS. 3A and 3B.

Figure 5A:
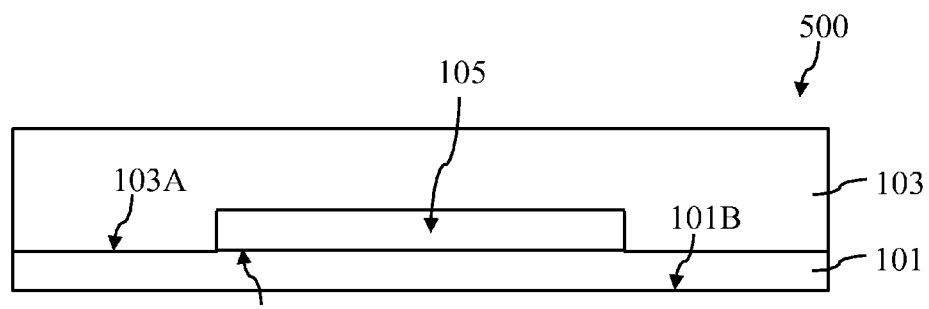
FIGS. 5A-5G, 6A and 6B illustrate cross-sectional views of intermediate stages of manufacture of a bonded structure in accordance with some embodiments.
Figure 5B:
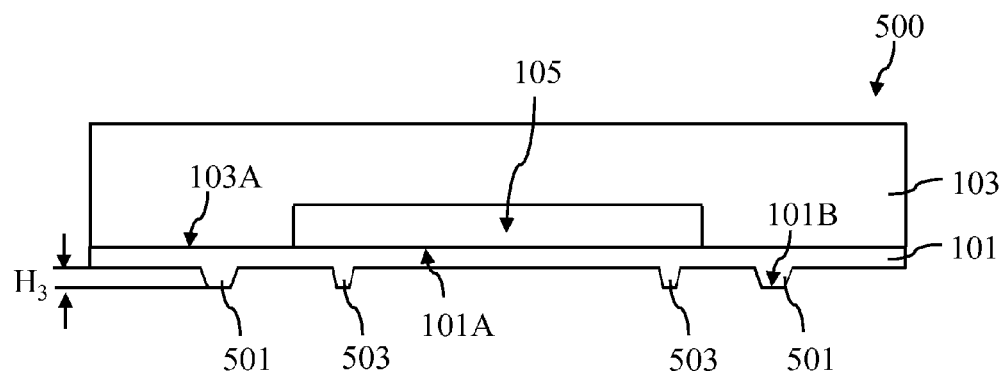
Figure 5C:
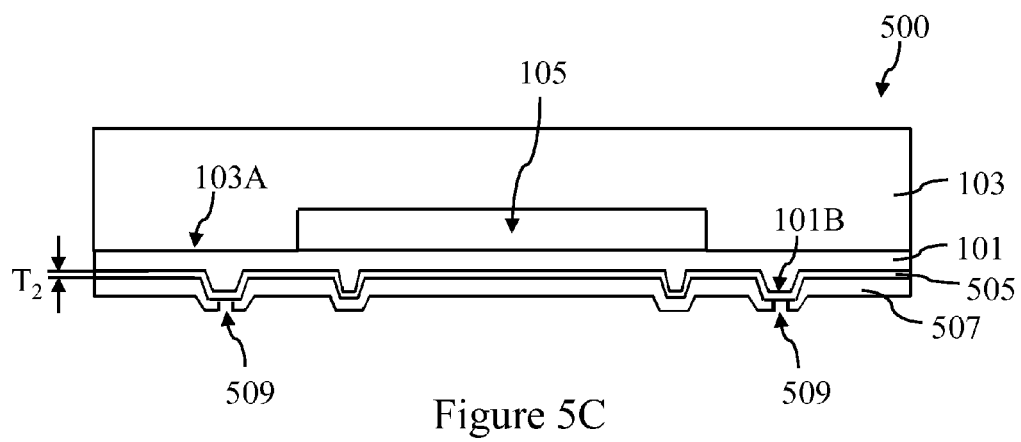
Figure 5D:
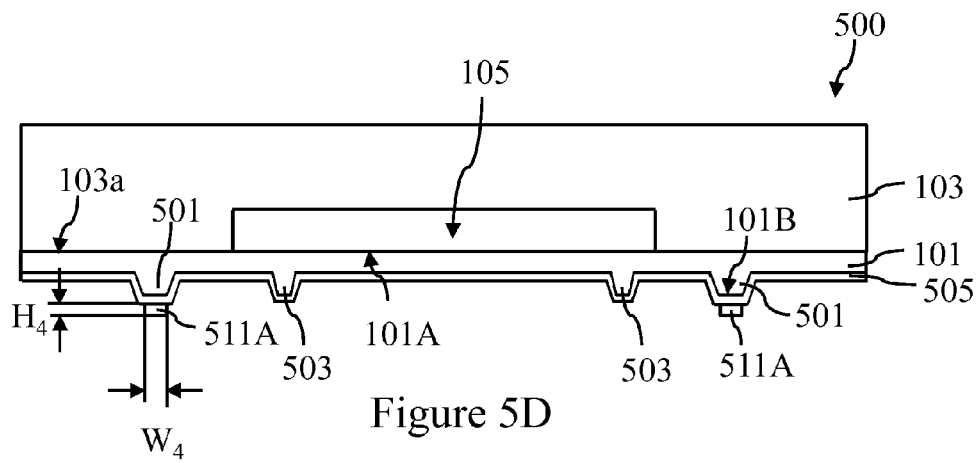
Figure 5E:
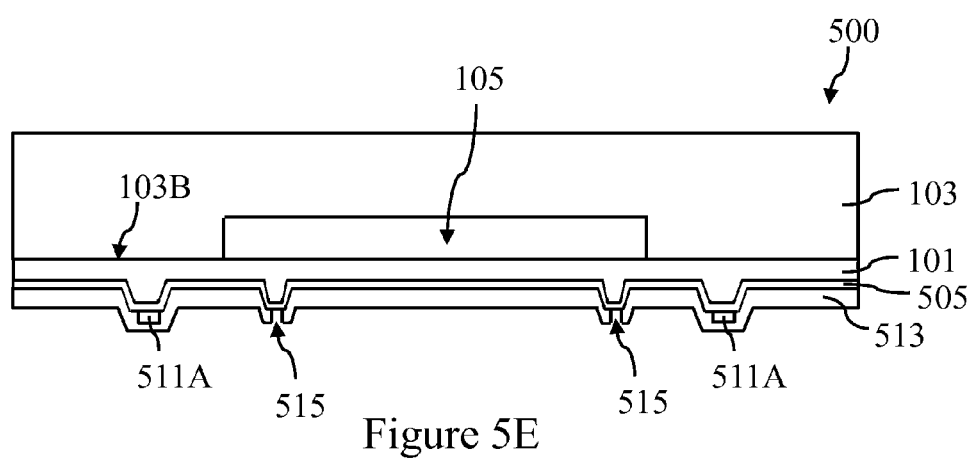
Figure 5F:
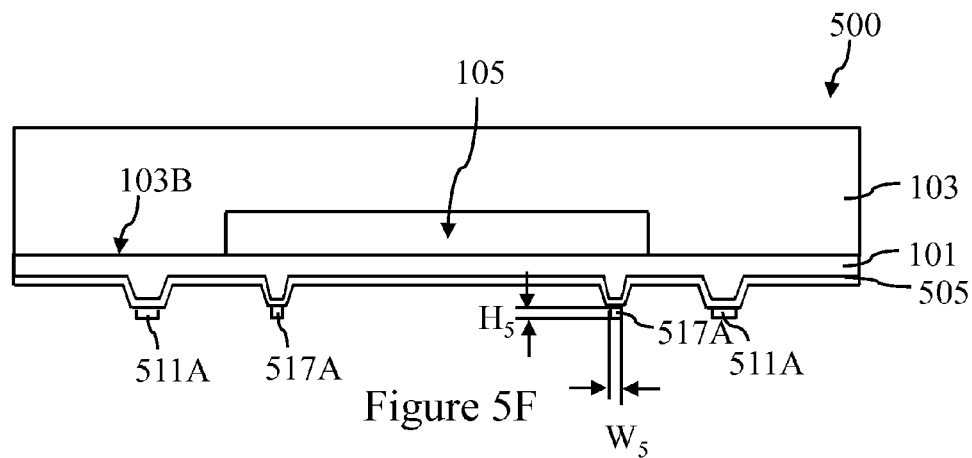
Figure 5G:
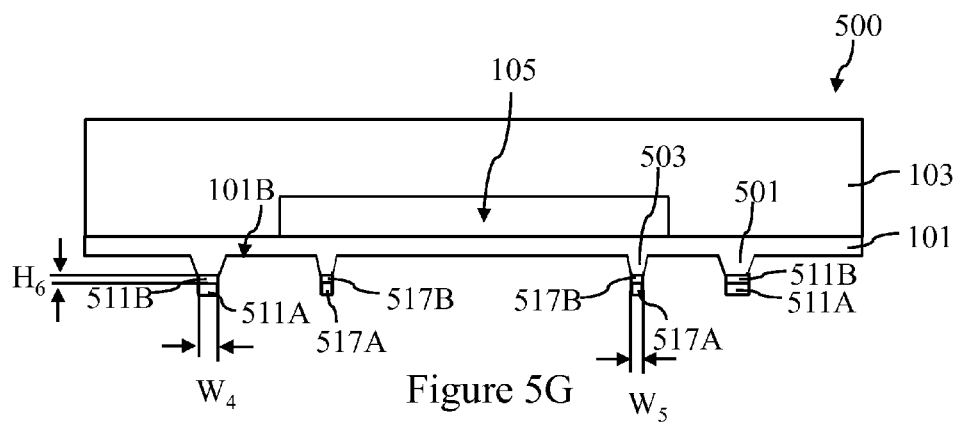
Figure 6A:
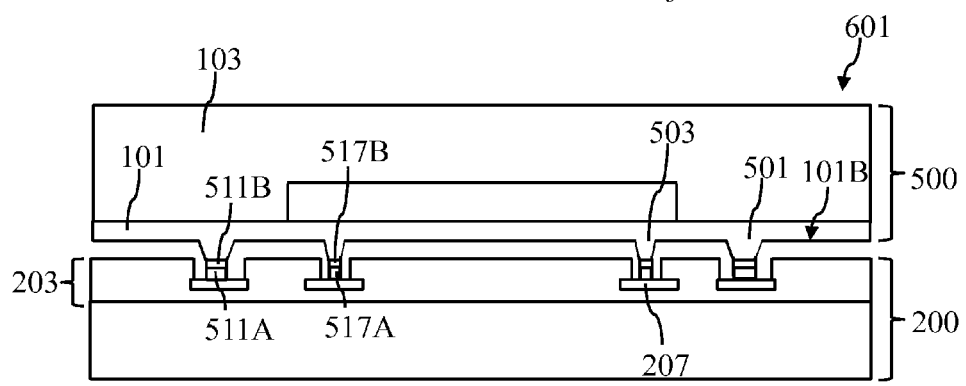
Figure 6B:
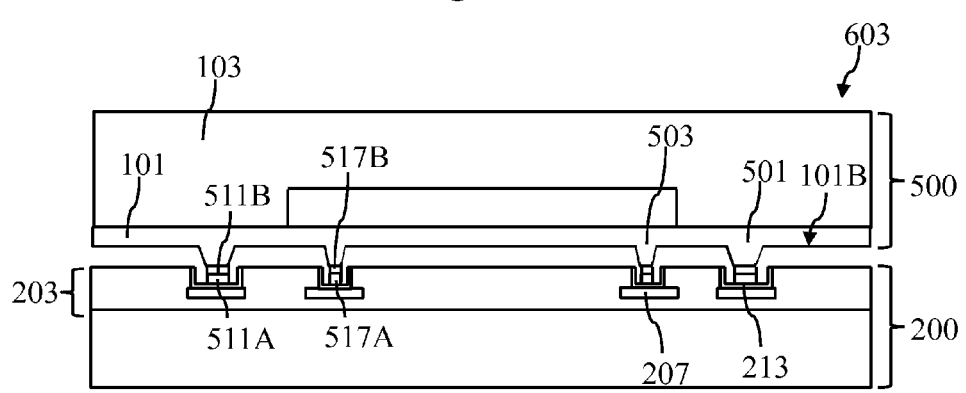

FIGS. 5A-5G, 6A and 6B illustrate cross-sectional views of intermediate stages of manufacture of a bonded structure in accordance with some embodiments. In particular, FIGS. 5A-5G illustrate cross-sectional views of intermediate stages of preparing a first bonded structure 500 comprising a first wafer 101 bonded to a second wafer 103 for a subsequent binding process. FIGS. 6A and 6B illustrate cross-sectional views of second bonded structures 601 and 603, respectively, comprising the first bonded structure 500 bonded to the CMOS wafer 200 in accordance with some embodiments.

Referring first to FIG. 5A, the first bonded structure 500 comprising the first wafer 101 bonded to the second wafer 103 is illustrated in accordance with some embodiments. In some embodiments, the first bonded structure 500 is similar to the first bonded structure 100 described above with reference to FIG. 1A, with similar elements labeled by similar numerical references, and the description is not repeated herein.

Referring to FIG. 5B, the second surface 101B of the MEMS wafer 101 is patterned to form first protruding features 501 and second protruding features 503. In some embodiments, the second surface 101B of the MEMS wafer 101 may be patterned using suitable lithography and etching methods. In some embodiments, the first protruding features 501 and the second protruding features 503 may have a height $H_3$ between about 1.5 μm and about 2.5 μm. In the illustrated embodiment, two first protruding features 501 are illustrated. However, in some embodiments, the two first protruding features 501 may be a part of a single continuous protruding feature as viewed from the top, and may have an annular circular shape, an annular rectangular shape, or the like. In some embodiments, top-view shapes of the second protruding features 503 may be circles, ovals, polygons such as triangles, rectangles, hexagons, or the like. In the illustrated embodiment, the number of the first protruding features 501 and the second protruding features 503 is provided for illustrative purpose only. In other embodiments, the number of the first protruding features 501 and the second protruding features 503 may vary according to design requirements of the MEMS wafer 101. As described below in greater detail, first bonding connectors 511A/511B and second bonding connectors 517A/517B will be formed on the first protruding features 501 and the second protruding features 503 (see, for example, FIG. 5G), respectively, and will be used to bond the first bonded structure 100 to the CMOS wafer 200.

Referring to FIG. 5C, a seed layer 505 is conformally formed on the patterned second surface 101B of the MEMS wafer 101. In some embodiments, the seed layer 505 may be formed using similar materials and methods as the conductive layer 107 described above with reference to FIG. 1B and the description is not repeated herein. In some embodiments, the seed layer 505 may be formed using an electro-chemical plating process, or the like. In some embodiments, the seed layer 505 may have a thickness $T_2$ between about 2200 Å and about 3500 Å. In some embodiments, the seed layer 505 comprises a layer of copper having a thickness between about 2000 Å and about 3000 Å formed over a layer of titanium having a thickness between about 200 Å and about 500 Å.

Referring further to FIG. 5C, a first patterned mask 507 having first openings 509 therein is formed on the exposed surface of the seed layer 505. In some embodiments, the first patterned mask 507 may be formed and patterned using similar materials and methods as the patterned mask 109 described above with reference to FIG. 1C and the description is not repeated herein. In the illustrated embodiment, the first openings 509 expose portions of the seed layer 505 disposed on the first protruding features 501. In some embodiments, top-view shapes of the first openings 509 may be similar to the top-view shapes of the first protruding features 501 described above with reference to FIG. 5B and the description is not repeated herein.

Referring to FIG. 5D, first portions 511A of the first bonding connectors 511A/511B (see, for example, FIG. 5G) are formed in the first openings 509. In some embodiments, the first portions 511A of the first bonding connectors 511A/511B may be formed using similar material and methods as the first portions 115A first bonding connectors 115A/115B described above with reference to FIG. 1D and the description is not repeated herein. In the illustrated embodiment, the first portions 511A of the first bonding connectors 511A/511B may be formed using an electro-chemical plating process, or the like. Subsequently, the first patterned mask 507 is removed to expose sidewalls of the first portions 511A of the first bonding connectors 511A/511B. In some embodiments, the first patterned mask 507 may be removed using similar methods as the patterned mask 109 described above with reference to FIG. 1D and the description is not repeated herein. In some embodiments, the first portions 511A of the first bonding connectors 511A/511B may have a height $H_4$ between about 0.2 µm and about 1 µm, and a width $W_4$ between about 30 µm and about 70 µm.

Referring to FIG. 5E, a second patterned mask 513 having second openings 515 therein is formed on the exposed surfaces of the seed layer 505 and the first portions 511A of the first bonding connectors 511A/511B. In some embodiments, the second patterned mask 513 may be formed and patterned using similar materials and methods as the patterned mask 109 described above with reference to FIG. 1C and the description is not repeated herein. In the illustrated embodiment, the second openings 515 expose portions of the seed layer 505 disposed on the second protruding features 503. In some embodiments, top-view shapes of the second openings 515 may be similar to the top-view shapes of the second protruding features 503 described above with reference to FIG. 5B and the description is not repeated herein.

Referring to FIG. 5F, first portions 517A of the second bonding connectors 517A/517B (see, for example, FIG. 5G) are formed in the second openings 515. In some embodiments, the first portions 517A of the second bonding connectors 517A/517B may be formed using similar material and methods as the first portions 115A first bonding connectors 115A/115B described above with reference to FIG. 1D and the description is not repeated herein. In the illustrated embodiment, the first portions 517A of the second bonding connectors 517A/517B may be formed using an electro-chemical plating process, or the like. Subsequently, the second patterned mask 513 is removed to expose the first portions 511A of the first bonding connectors 511A/511B and the first portions 517A of the second bonding connectors 517A/517B. In some embodiments, the second patterned mask 513 may be removed using similar methods as the patterned mask 109 described above with reference to FIG. 1D and the description is not repeated herein. In some embodiments, the first portions 517A of the second bonding connectors 517A/517B may have a height $H_5$ between about 0.2 µm and about 1 µm, and a width $W_5$ between about 10 µm and about 50 µm. In the illustrated embodiment, the height $H_5$ of the first portions 517A of the second bonding connectors 517A/517B is substantially equal to the height $H_4$ of the first portions 511A of the first bonding connectors 511A/511B. In other embodiments, the height $H_5$ of the first portions 517A of the second bonding connectors 517A/517B is different from the height $H_4$ of the first portions 511A of the first bonding connectors 511A/511B.

Referring further to FIG. 5G, the seed layer 505 is patterned to form second portions 511B of the first bonding connectors 511A/511B and second portions 517B of the second bonding connectors 517A/517B. In some embodiments, the seed layer 505 may be patterned using similar methods as the conductive layer 107 described above with reference to FIG. 1E and the description is not repeated herein. Accordingly, in the illustrated embodiment, the second portions 511B of the first bonding connectors 511A/511B have the width $W_4$ and the second portions 517B of the second bonding connectors 517A/517B have the width $W_5$. Furthermore the second portions 511B of the first bonding connectors 511A/511B and the second portions 517B of the first bonding connectors 517A/517B have a height $H_6$, which is equal to the thickness $T_2$ of the seed layer 505.

Referring further to FIG. 5G, top-view shapes of the first bonding connectors 511A/511B and the second bonding connectors 517A/517B are similar to the top-view shapes of the first openings 509 and the second openings 515, respectively, and the description is not repeated herein. In what follows, the first bonding connectors 511A/511B may be also referred to as a bond ring 511A/511B and the second bonding connectors 517A/517B may be also referred to as bond pads 517A/517B. As described below in greater detail, the first bonding connectors 511A/511B and the second bonding connectors 517A/517B will be used to bond and electrically couple the first bonded structure 500 to the third wafer 200 (see, for example, FIGS. 6A and 6B). As described above with reference to FIG. 5A-5G, the first bonding connectors 511A/511B and the second bonding connectors 517A/517B are formed during separate process steps using the first patterned mask 507 and the second patterned mask 513, respectively. This advantageously allows for forming bonding connectors having high thickness uniformity, since openings (such as the first openings 509 or the second openings 515) of similar shapes and sizes are filled during each process step.

FIG. 6A illustrates a cross-sectional view of a second bonded structure 601 comprising the first bonded structure 500 bonded to the CMOS wafer 200 shown in FIG. 2A in accordance with some embodiments. In the illustrated embodiment, the CMOS wafer 200 is bonded to the first bonded structure 500 without forming the UBMs 213 in the first openings 209 and the second openings 211. In some embodiments, the first bonding connectors 511A/511B and the second bonding connectors 517A/517B of the first bonded structure 500 are aligned opposite to the first openings 209 and the second openings 211 (see FIG. 2A), respectively, of the CMOS wafer 200. Subsequently, the first bonded structure 500 and the CMOS wafer 200 are brought into contact such that the first bonding connectors 511A/511B and the second bonding connectors 517B/517B extend into the first openings 209 and the second openings 211, respectively, and contact respective exposed conducive features 207 of the RDLs 203.

In some embodiments wherein the first portions 511A of the first bonding connectors 511A/511B and the first portions 517A of the second bonding connectors 517A/517B are formed of a solder such as, for example, tin (Sn), a bonding process may be performed at temperature that is below a reflow temperature of the solder. In such embodiments, the first portions 511A of the first bonding connectors 511A/511B and the first portions 517A of the second bonding connectors 517A/517B do not change shapes, and the first portions 511A of the first bonding connectors 511A/511B and the first portions 517A of the second bonding connectors 517A/517B are bonded to the respective conductive features 207 of the RDLs 203 using, for example, a diffusion soldering method. In other embodiments, the first bonding connectors 511A/511B and the second bonding connectors 517A/517B may be bonded to the respective conductive features 207 of the RDLs 203 using a reflow process described above with reference to FIG. 3A and the description is not repeated herein. In some embodiments, the first bonding connectors 511A/511B and the second bonding connectors 517A/517B mechanically and electrically couple the first bonded structure 500 to the CMOS wafer 200. In some embodiments wherein the first bonding connectors 511A/511B form a bond ring, the first bonding connectors 511A/511B may provide only mechanical bonds and may be electrically inert. In such embodiments, the bond ring 511A/511B may hermetically seal the MEMS devices of the MEMS wafer 101 from external environment. In other embodiments, the bond ring 511A/511B may be electrically coupled to the ground. In yet other embodiments, the bond ring 511A/511B may be electrically coupled to the MEMS devices of the MEMS wafer 101 and to the various active and passive devices of the CMOS wafer 200.

FIG. 6B illustrates a cross-sectional views of a second bonded structure 603 comprising the first bonded structure 500 bonded to the CMOS wafer 200 shown in FIG. 2C in accordance with some embodiments. In the illustrated embodiment, the CMOS wafer 200 is bonded to the first bonded structure 500 after forming the UBMs 213 in the first openings 209 and the second openings 211 (see, FIG. 2C). In some embodiments, the second bonded structure 603 may be formed using similar methods as the second bonded structure 601 described above with reference to FIG. 6A and the description is not repeated herein. In the illustrated embodiments, the UBMs 213 are interposed between the first bonding connectors 511A/511B and the respective conductive features 207 of the RDLs 203, and between the second bonding connectors 517A/517B and the respective conductive features 207 of the RDLs 203.

Figure 7:
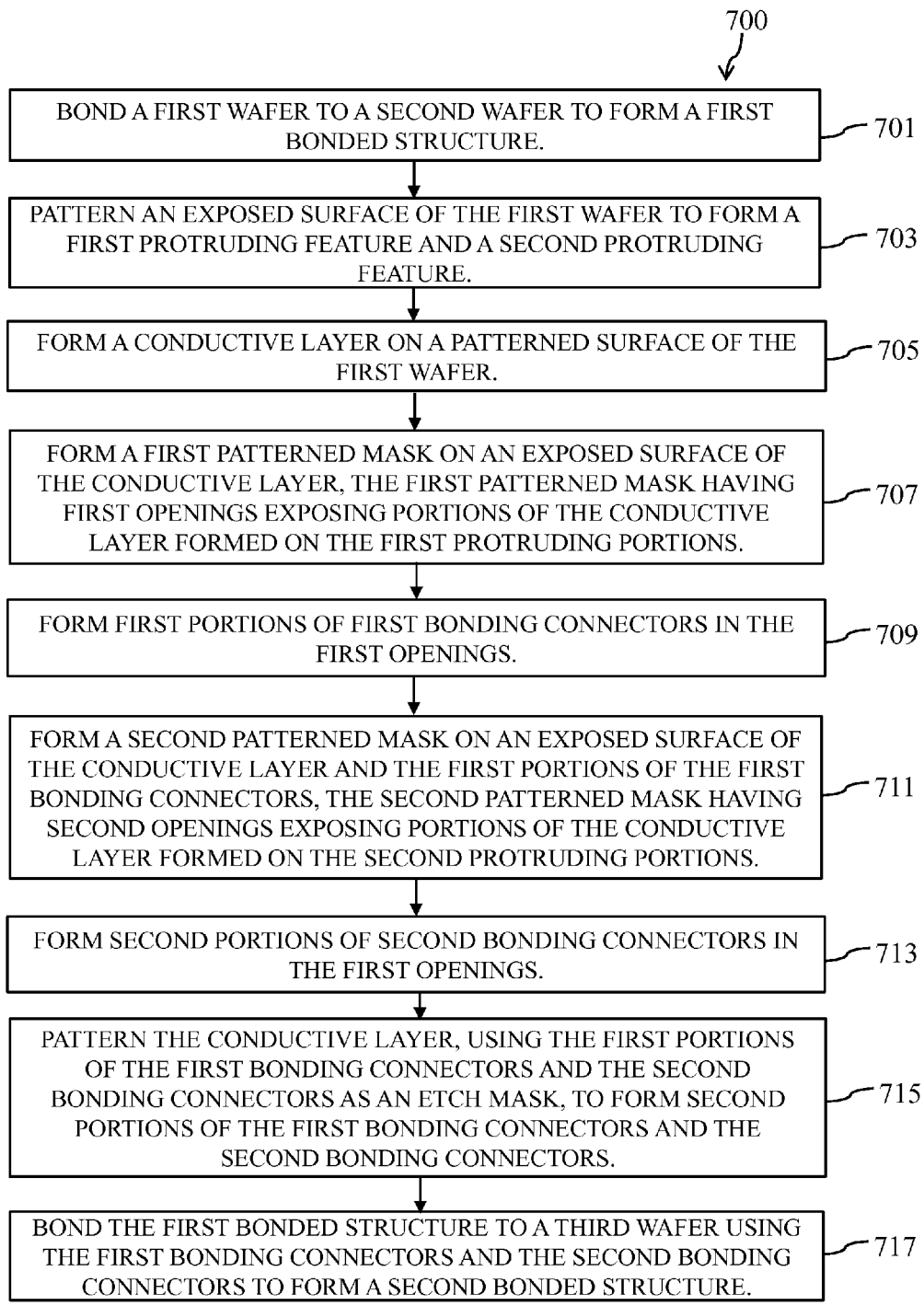
FIG. 7 is a flow diagram illustrating a method of forming a bonded structure in accordance with some embodiments.

FIG. 7 is a flow diagram illustrating a method 700 of forming a bonded structure (such as the second bonded structures 601 or 603) in accordance with some embodiments. The method 700 starts with step 701, wherein a first wafer (such as the MEMS wafer 101) is bonded to a second wafer (such as the cap wafer 103) to form a first bonded structure (such as the first bonded structure 500) as described above with reference to FIG. 5A. In step 703, an exposed surface of the first wafer is patterned to form first protruding features and second protruding features (such as the first protruding features 501 and the second protruding features 503) as described above with reference to FIG. 5B. In step 705, a conductive layer (such as the seed layer 505) is formed on a patterned surface of the first wafer as described above with reference to FIG. 5C. In step 707, a first patterned mask (such as the first patterned mask 507) having first openings (such as the first openings 509) is formed on an exposed surface of the conductive layer as described above with reference to FIG. 5C. In step 709, first portions of first bonding connectors (such as the first portions 511A of the first bonding connectors 511A/511B) are formed in the first openings as described above with reference to FIG. 5D. In step 711, a second patterned mask (such as the second patterned mask 513) having second openings (such as the second openings 515) is formed on an exposed surface of the conductive layer and the first portions of the first bonding connectors as described above with reference to FIG. 5E. In step 713, first portions of second bonding connectors (such as the first portions 517A of the second bonding connectors 517A/517B) are formed in the second openings as described above with reference to FIG. 5F. In step 715, the conductive layer is patterned to form second portions of the first bonding connectors and the second bonding connectors (such as the second portions 511B of the first bonding connectors 511A/511B and the second portions 517B of the second bonding connectors 517A/517B) as described above with reference to FIG. 5G. In some embodiments, the first portions of the first bonding connectors and the second bonding connectors may be used as an etch mask for the conductive layer. In step 717, the first bonded structure is bonded to a third wafer (such as the CMOS wafer 200) using the first bonding connectors and the second bonding connectors to form a second bonded structure (such as, for example, the second bonded structures 601 or 603) as described above with reference to FIGS. 6A and 6B.

Figure 8A:
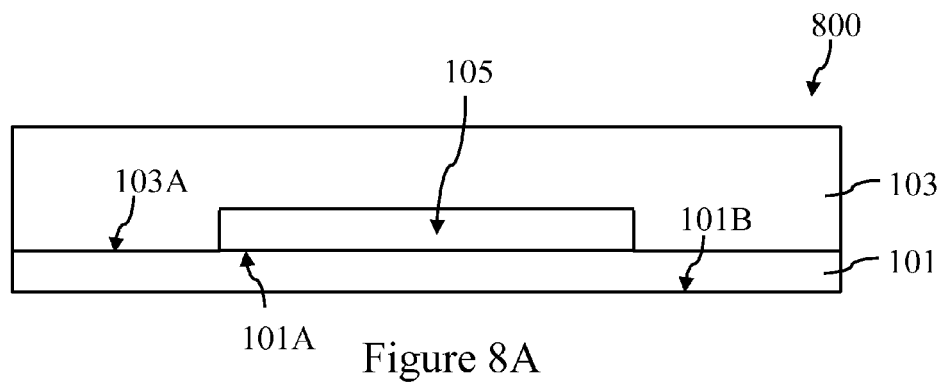
FIGS. 8A-8E, 9A and 9B illustrate cross-sectional views of intermediate stages of manufacture of a bonded structure in accordance with some embodiments.
Figure 8B:
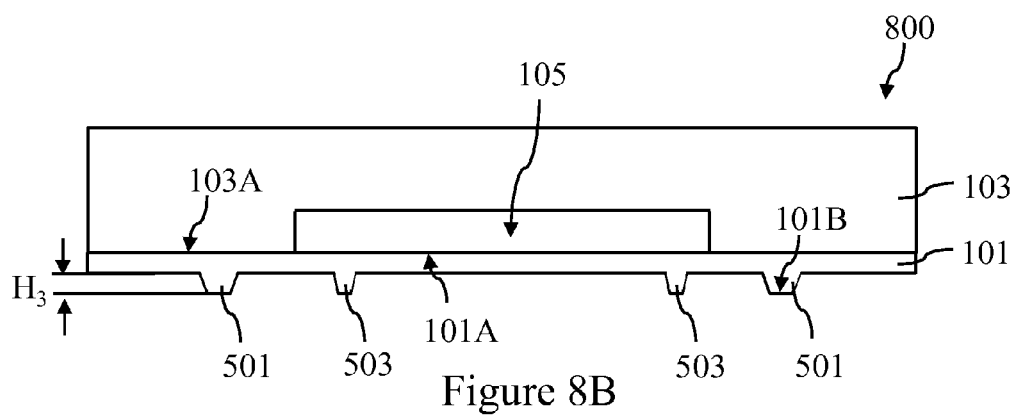
Figure 8C:
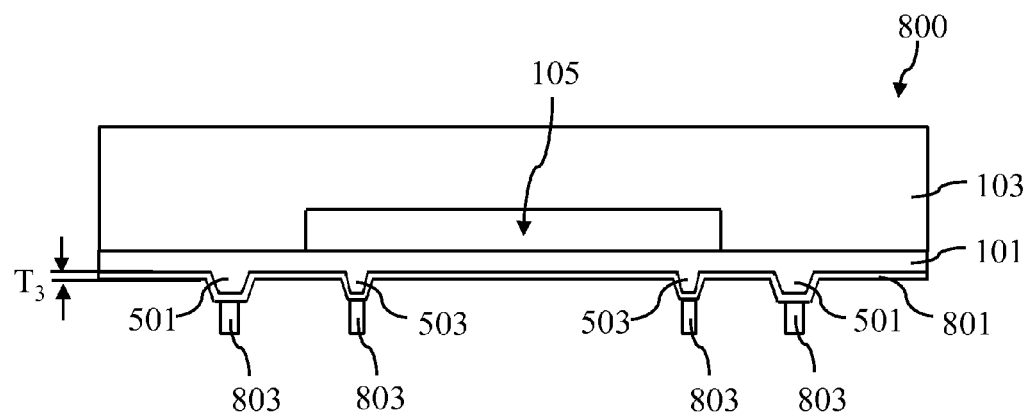
Figure 8D:
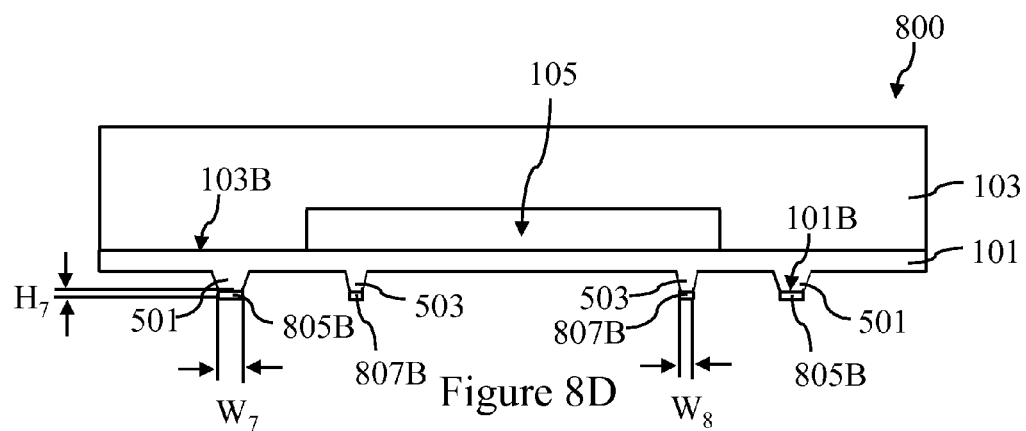
Figure 8E:
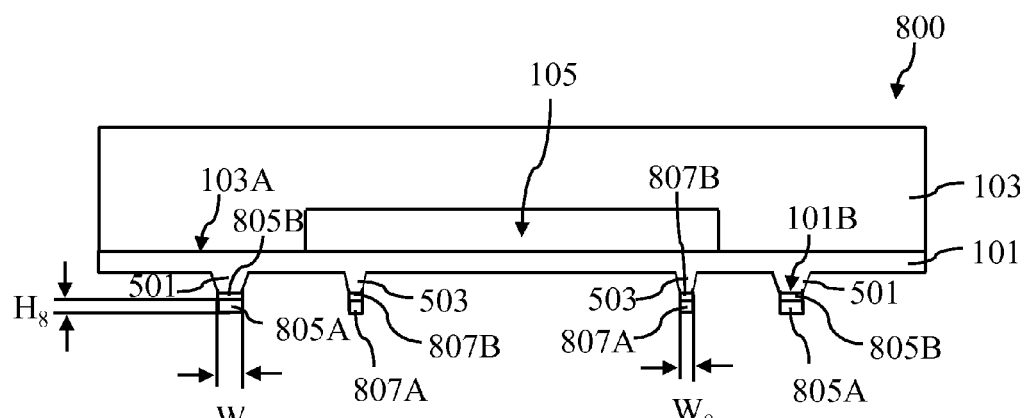
Figure 9A:
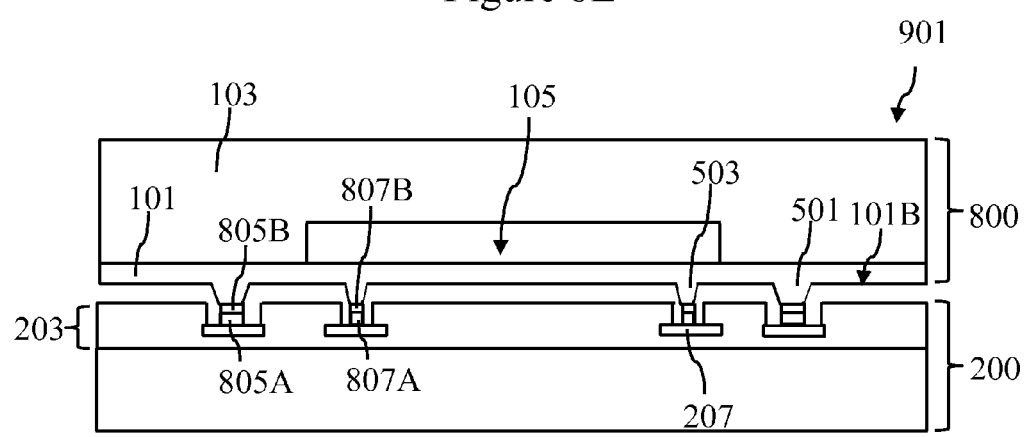
Figure 9B:
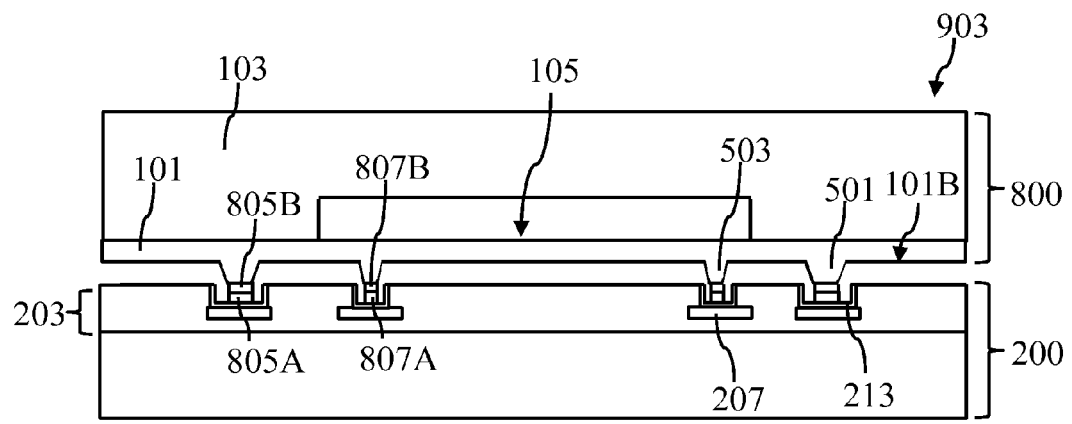

FIGS. 8A-8E, 9A and 9B illustrate cross-sectional views of intermediate stages of manufacture of a bonded structure in accordance with some embodiments. In particular, FIGS. 8A-8E illustrate cross-sectional views of intermediate stages of preparing a first bonded structure 800 comprising a first wafer 101 bonded to a second wafer 103 for a subsequent binding process. FIGS. 9A and 9B illustrate cross-sectional views of second bonded structures 901 and 903, respectively, comprising the first bonded structure 800 bonded to the CMOS wafer 200 in accordance with some embodiments.

Referring first to FIG. 8A, the first bonded structure 800 comprising the first wafer 101 bonded to the second wafer 103 is illustrated in accordance with some embodiments. In some embodiments, the first bonded structure 800 is similar to the first bonded structure 100 described above with reference to FIG. 1A, with similar elements labeled by similar numerical references, and the description is not repeated herein.

FIG. 8B illustrates the first bonded structure 800 after the second surface 101B of the MEMS wafer 101 is patterned to form first protruding features 501 and second protruding features 503. In some embodiments, the first bonded structure 800 shown in FIG. 8B is similar to the first bonded structure 500 described above with reference to FIG. 5B, with similar elements labeled by similar numerical references, and the description is not repeated herein. As described below in greater detail, first bonding connectors 805A/805B and second bonding connectors 807A/807B (see, for example, FIG. 8E) will be formed on the first protruding features 501 and the second protruding features 503, respectively, and will be used to bond the first bonded structure 800 to the CMOS wafer 200.

Referring to FIG. 8C, a seed layer 801 is conformally formed on the patterned second surface 101B of the MEMS wafer 101. In the illustrated embodiment, the seed layer 801 may be formed using sputtering, or the like. In other embodiments, the seed layer 801 may be formed using similar materials and methods as the conductive layer 107 described above with reference to FIG. 1B and the description is not repeated herein. In some embodiments, the seed layer 801 may have a thickness $T_3$ between about 2200 Å and about 3500 Å. In some embodiments, the seed layer 801 comprises a layer of copper having a thickness between about 2000 Å and about 3000 Å formed over a layer of titanium having a thickness between about 200 Å and about 500 Å.

Referring further to FIG. 8C, a patterned mask 803 is formed on the exposed surface of the seed layer 801. In some embodiments, the patterned mask 803 may be formed and patterned using similar materials and methods as the pattern mask 109 described above with reference to FIG. 1C and the description is not repeated herein. In the illustrated embodiment, the patterned mask 803 protects portions of the seed layer 801 disposed on the first protruding features 501 and the second protruding features 503.

Referring to FIG. 8D, exposed portions of the seed layer 801 are removed to form second portions 805B of the first bonding connectors 805A/805B on the first protruding features 501 and second portions 807B of the second bonding connectors 807A/807B on the second protruding features 503. In some embodiments, the seed layer 801 may be patterned using similar methods as the conductive layer 107 described above with reference to FIG. 1E and the description is not repeated herein. Accordingly, in the illustrated embodiment, the second portions 805B and 807B have a height $H_7$, which is equal to the thickness $T_3$ of the seed layer 801. In some embodiments, the second portions 805B may have a width $W_7$ between about 30 μm and about 50 μm, and the second portions 807B may have a width $W_8$ between about 10 μm and about 50 μm.

Referring to FIG. 8E, first portions 805A are formed on the second portions 805B to form the first bonding connectors 805A/805B and first portions 807A are formed on the second portions 807B to form the second bonding connectors 807A/807B. In the illustrated embodiment, the first portions 805A and 807A may be formed using an electroless plating process, or the like. Accordingly, the first portions 805A have the width $W_7$ and the first portions 807A have the width $W_8$. In some embodiments, the first portions 805A and 807A have a height $H_8$ between about 0.2 μm and about 1 μm.

Referring further to FIG. 8E, top-view shapes of the first bonding connectors 805A/805B and the second bonding connectors 807A/807B are similar to the top-view shapes of the first protruding features 501 and the second protruding features 503 described above with reference to FIG. 5B, respectively, and the description is not repeated herein. In what follows, the first bonding connectors 805A/805B may be also referred to as a bond ring 805A/805B and the second bonding connectors 807A/807B may be also referred to as bond pads 807A/807B. As described below in greater detail, the first bonding connectors 805A/805B and the second bonding connectors 807A/807B will be used to bond and electrically couple the first bonded structure 800 to the third wafer 200 (see, for example, FIGS. 9A and 9B). As described above with reference to FIG. 8A-8E, the seed layer 801 is formed using sputtering, while the first portions 805A and 807A are formed using an electroless plating process, which advantageously allows for forming bonding connectors having high thickness uniformity.

FIG. 9A illustrates a cross-sectional view of a second bonded structure 901 comprising the first bonded structure 800 bonded to the CMOS wafer 200 shown in FIG. 2A in accordance with some embodiments. In some embodiments, the second bonded structure 901 may be formed using similar methods as the second bonded structure 601 described above with reference to FIG. 6A and the description is not repeated herein.

FIG. 9B illustrates a cross-sectional views of a second bonded structure 903 comprising the first bonded structure 800 bonded to the CMOS wafer 200 shown in FIG. 2C in accordance with some embodiments. In the illustrated embodiment, the CMOS wafer 200 is bonded to the first bonded structure 800 after forming the UBMs 213 in the first openings 209 and the second openings 211 (see, FIGS. 2B and 2C). In some embodiments, the second bonded structure 903 may be formed using similar methods as the second bonded structure 603 described above with reference to FIG. 6B and the description is not repeated herein.

Figure 10:
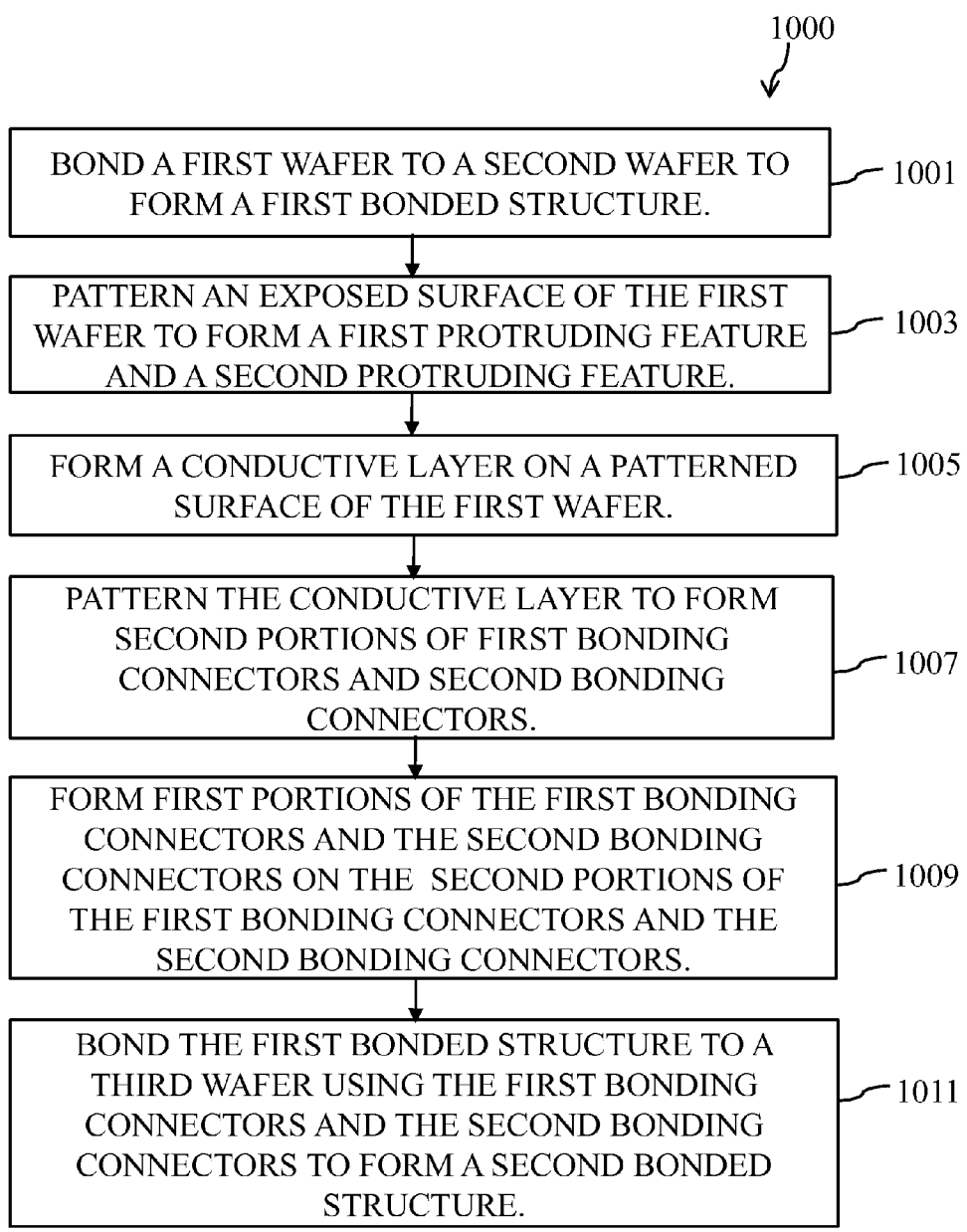
FIG. 10 is a flow diagram illustrating a method of forming a bonded structure in accordance with some embodiments.

FIG. 10 is a flow diagram illustrating a method 1000 of forming a bonded structure (such as the second bonded structures 901 or 903) in accordance with some embodiments. The method 1000 starts with step 1001, wherein a first wafer (such as the MEMS wafer 101) is bonded to a second wafer (such as the cap wafer 103) to form a first bonded structure (such as the first bonded structure 800) as described above with reference to FIG. 8A. In step 1003, an exposed surface of the first wafer is patterned to form first protruding features and second protruding features (such as the first protruding features 501 and the second protruding features 503) as described above with reference to FIG. 8B. In step 1005, a conductive layer (such as the seed layer 801) is formed on a patterned surface of the first wafer as described above with reference to FIG. 8C. In step 1007, the conductive layer is patterned to form second portions of first bonding connectors and the second bonding connectors (such as the second portions 805B of the first bonding connectors 805A/805B and the second portions 807B of the second bonding connectors 807A/807B) as described above with reference to FIGS. 8C and 8D. In step 1009, the first portions of the first bonding connectors (such as the first portions 805A of the first bonding connectors 805A/805B) are formed on the respective second portions of the first bonding connectors and the first portions of the second bonding connectors (such as the first portions 807A of the second bonding connectors 807A/807B) are formed on the respective second portions of the second bonding connectors as described above with reference to FIG. 8E. In step 1011, the first bonded structure is bonded to a third wafer (such as the CMOS wafer 200) using the first bonding connectors and the second bonding connectors to form a second bonded structure (such as, for example, the second bonded structures 901 or 903) as described above with reference to FIGS. 9A and 9B.

Embodiments presented herein provide various benefits, such as high tackiness uniformity for bonding connectors and cost reduction. In some embodiments, during formation of the bonding connectors patterning of wafers is avoided, which advantageously allows for forming bonding connectors having high thickness uniformity with reduced cost. In some embodiments, a two mask approach allows for separating bond ring stage and bond pad stage, which advantageously allows for forming bonding connectors with high thickness uniformity. In some embodiments, deposition processes such as sputtering and electroless plating are used during formation of the bonding connectors, which advantageously allows for forming bonding connectors with high thickness uniformity.

According to an embodiment, a method includes forming a conductive layer on a first surface of a bonded structure, the bonded structure comprising a first substrate bonded to a second substrate, the first surface of the bonded structure being an exposed surface of the first substrate. A patterned mask is formed on the conductive layer, the patterned mask comprising first openings and second openings, the first openings and the second openings exposing portions of the conductive layer. First portions of first bonding connectors are formed in the first openings and first portions of second bonding connectors in the second openings. The conductive layer is patterned to form second portions of the first bonding connectors and second portions of the second bonding connectors, wherein the first portions of the first bonding connectors and the first portions of the second bonding connectors are used as a mask. The bonded structure is bonded to a third substrate using the first bonding connectors and the second bonding connectors, wherein the first bonding connectors and the second bonding connectors extend through third openings formed on a front side of the third substrate and contact conductive features exposed by the third openings.

According to another embodiment, a method includes forming first protruding features and second protruding features on a backside of a first substrate. A first conductive material is formed on the first protruding features and the second protruding features. First portions of first bonding connectors are formed on the first protruding features. First portions of second bonding connectors are formed on the second protruding features. The first conductive material is patterned to form second portions of the first bonding connectors and second portions of the second bonding connectors, wherein the first portions of the first bonding connectors and the first portions of the second bonding connectors are used as a mask. A second substrate is bonded to the first substrate using the first bonding connectors and the second bonding connectors.

According to yet another embodiment, a method includes patterning a back surface of a first substrate to form first protruding features and second protruding features. Second portions of first bonding connectors are formed on the first protruding features and second portions of second bonding connectors on the second protruding features. First portions of the first bonding connectors are formed on the second portions of the first bonding connectors and first portions of the second bonding connectors are formed on the second portions of the second bonding connectors. A second substrate is bonded to the first substrate using the first bonding connectors and the second bonding connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a conductive layer on a first surface of a bonded structure, the bonded structure comprising a first substrate bonded to a second substrate, the first surface of the bonded structure being an exposed surface of the first substrate;
    forming a patterned mask on the conductive layer, the patterned mask comprising first openings and second openings, the first openings and the second openings exposing portions of the conductive layer;
    forming first portions of first bonding connectors in the first openings and first portions of second bonding connectors in the second openings;
    removing the patterned mask from the conductive layer;
    after removing the patterned mask, patterning the conductive layer to form second portions of the first bonding connectors and second portions of the second bonding connectors, wherein the first portions of the first bonding connectors and the first portions of the second bonding connectors are used as a mask; and
    bonding the bonded structure to a third substrate using the first bonding connectors and the second bonding connectors, wherein the first bonding connectors and the second bonding connectors extend through third openings formed on a front side of the third substrate and contact conductive features exposed by the third openings.

2. The method of claim 1, wherein the first substrate is a MEMS wafer and the second substrate is a cap wafer.

3. The method of claim 2, wherein the third substrate is a CMOS wafer.

4. The method of claim 1, wherein the first bonding connectors form a bond ring.

5. The method of claim 4, wherein the second bonding connectors are enclosed by the bond ring.

6. The method of claim 1, wherein after bonding the bonded structure to the third substrate, the first portions of the first bonding connectors extend along sidewalls of respective second portions of the first bonding connectors.

7. The method of claim 1, wherein a thickness of the first bonding connectors is substantially same as a thickness of the second bonding connectors.

8. A method comprising:
    forming first protruding features and second protruding features on a backside of a first substrate, wherein each of the first protruding features comprises a first surface and a second surface, the first surface forming a first non-zero angle with the second surface, and wherein each of the second protruding features comprises a third surface and a fourth surface, the third surface forming a second non-zero angle with the fourth surface;
    forming a first conductive material on the first protruding features and the second protruding features, wherein the first conductive material extends along the first surface and the second surface of each of the first protruding features and the third surface and the fourth surface of each of the second protruding features;
    forming first portions of first bonding connectors on the first protruding features;
    forming first portions of second bonding connectors on the second protruding features;
    patterning the first conductive material to form second portions of the first bonding connectors and second portions of the second bonding connectors, wherein the first portions of the first bonding connectors and the first portions of the second bonding connectors are used as a mask; and
    bonding a second substrate to the first substrate using the first bonding connectors and the second bonding connectors.

9. The method of claim 8, wherein forming the first portions of the first bonding connectors comprises:
    forming a first patterned mask on the first conductive material, the first patterned mask having first openings therein, the first openings exposing portions of the first conductive material disposed on the first protruding features;
    forming a second conductive material in the first openings, the second conductive material being different from the first conductive material; and
    removing the first patterned mask.

10. The method of claim 9, wherein forming the first portions of the second bonding connectors comprises:
    forming a second patterned mask on the first conductive material, the second patterned mask having second openings therein, the second openings exposing portions of the first conductive material disposed on the second protruding features;
    forming the second conductive material in the second openings; and
    removing the second patterned mask.

11. The method of claim 8, wherein the first bonding connectors form a bond ring.

12. The method of claim 11, wherein the second bonding connectors are enclosed by the bond ring.

13. The method of claim 8, further comprising, before bonding the second substrate to the first substrate, forming third openings and fourth openings on a front surface of the second substrate, the third openings exposing first conductive features and the fourth openings exposing second conductive features.

14. The method of claim 13, wherein the first bonding connectors extend into the third openings and contact the first conducive features, and wherein the second bonding connectors extend into the fourth openings and contact the second conducive features.

15. A method comprising:
 patterning a back surface of a first substrate to form first protruding features and second protruding features, wherein the first protruding features, the second protruding features and the first substrate comprise a same semiconducting material;
 forming second portions of first bonding connectors on the first protruding features and second portions of second bonding connectors on the second protruding features;
 forming first portions of the first bonding connectors on the second portions of the first bonding connectors and first portions of the second bonding connectors on the second portions of the second bonding connectors; and
 bonding a second substrate to the first substrate using the first bonding connectors and the second bonding connectors.

16. The method of claim 15, wherein forming the second portions of the first bonding connectors and the second portions of the second bonding connectors comprises:
 sputtering a first conductive material on the first protruding features and the second protruding features; and
 patterning the first conductive material.

17. The method of claim 16, wherein forming the first portions of the first bonding connectors and the first portions of the second bonding connectors comprises forming a second conductive material on the first conductive material by an electroless plating method, the second conductive material being different from the first conductive material.

18. The method of claim 15, wherein a thickness of the first bonding connectors is substantially same as a thickness of the second bonding connectors.

19. The method of claim 15, wherein the first bonding connectors form a bond ring.

20. The method of claim 19, wherein the second bonding connectors are bond pads, the bond pads being enclosed by the bond ring.

* * * * *